(12) United States Patent
Nomura et al.

(10) Patent No.: US 7,719,001 B2
(45) Date of Patent: May 18, 2010

(54) SEMICONDUCTOR DEVICE WITH METAL OXIDES AND AN ORGANIC COMPOUND

(75) Inventors: Ryoji Nomura, Yamato (JP); Hajime Tokunaga, Isehara (JP); Kiyoshi Kato, Atsugi (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 133 days.

(21) Appl. No.: 11/808,498

(22) Filed: Jun. 11, 2007

(65) Prior Publication Data

US 2008/0001143 A1    Jan. 3, 2008

(30) Foreign Application Priority Data

Jun. 28, 2006    (JP) .............................. 2006-177737

(51) Int. Cl.
*H01L 35/24*    (2006.01)
(52) U.S. Cl. ...................... 257/40; 257/2; 257/E29.002; 257/E29.029; 257/E21.002; 438/99; 438/102; 438/103; 365/163
(58) Field of Classification Search ................. 257/2–5, 257/40, E21.002, E29.002, E29.029; 438/102–103, 438/99; 365/163
See application file for complete search history.

(56) References Cited

U.S. PATENT DOCUMENTS

| | | | |
|---|---|---|---|
| 5,108,855 A * | 4/1992 | Daifuku et al. | ............. 429/213 |
| 6,055,180 A | 4/2000 | Gudesen et al. | |
| 6,815,286 B2 | 11/2004 | Krieger et al. | |
| 6,950,331 B2 | 9/2005 | Yang et al. | |
| 2002/0140574 A1* | 10/2002 | Starkey et al. | ......... 340/870.16 |
| 2003/0183699 A1 | 10/2003 | Masui | |
| 2004/0027849 A1 | 2/2004 | Yang et al. | |
| 2004/0057323 A1 | 3/2004 | Tanabe | |
| 2006/0214008 A1 | 9/2006 | Asami et al. | |

(Continued)

FOREIGN PATENT DOCUMENTS

CN        1267389        9/2000

(Continued)

OTHER PUBLICATIONS

International Search Report (Application No. PCT/JP2005/019156) dated Jan. 31, 2006.
Office Action (Application No. 200710127086.4) dated Jan. 15, 2010.

*Primary Examiner*—Bradley K Smith
*Assistant Examiner*—Jami M Valentine
(74) *Attorney, Agent, or Firm*—Eric J. Robinson; Robinson Intellectual Property Law Office, P.C.

(57) ABSTRACT

A semiconductor memory device is disclosed in which a layer containing an organic compound is interposed between a pair of electrodes and, further, a first layer including a first metal oxide and a second layer including a second metal oxide are interposed between the pair of electrodes. One of the two layers including the metal oxide acts as a p-type semiconductor layer and the other acts as an n-type semiconductor layer. The first layer including the first metal oxide and the second layer including the second metal oxide form a p-n junction, which provides rectification characteristic to the semiconductor memory device.

6 Claims, 10 Drawing Sheets

U.S. PATENT DOCUMENTS

| | | |
|---|---|---|
| 2006/0286737 A1 * | 12/2006 | Levy et al. .................. 438/199 |
| 2007/0051940 A1 | 3/2007 | Clemens et al. |
| 2007/0153565 A1 | 7/2007 | Nomura et al. |

FOREIGN PATENT DOCUMENTS

| | | |
|---|---|---|
| JP | 2001-503183 | 3/2001 |
| JP | 2001-345431 | 12/2001 |
| JP | 2002-026277 | 1/2002 |
| JP | 2005-311336 | 11/2005 |
| WO | WO 2004/015778 | 2/2004 |
| WO | WO 2005/096380 | 10/2005 |
| WO | WO 2006/043573 | 4/2006 |
| WO | WO 2006/043611 | 4/2006 |
| WO | WO 2006/043687 | 4/2006 |
| WO | WO 2006/101241 | 9/2006 |

* cited by examiner

FIG. 2A
FIG. 2C
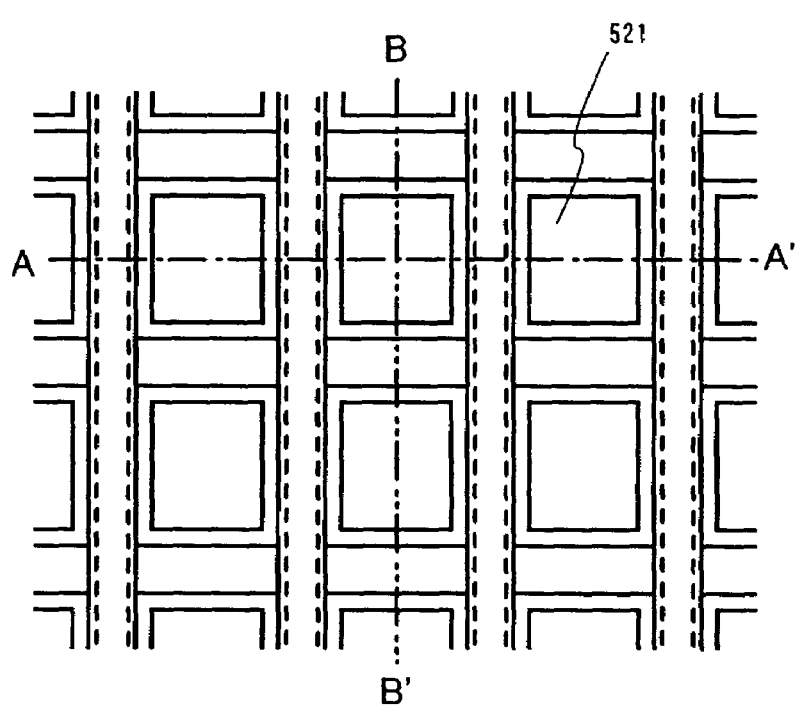
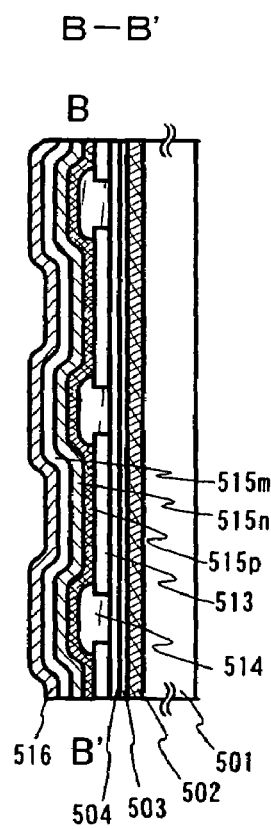
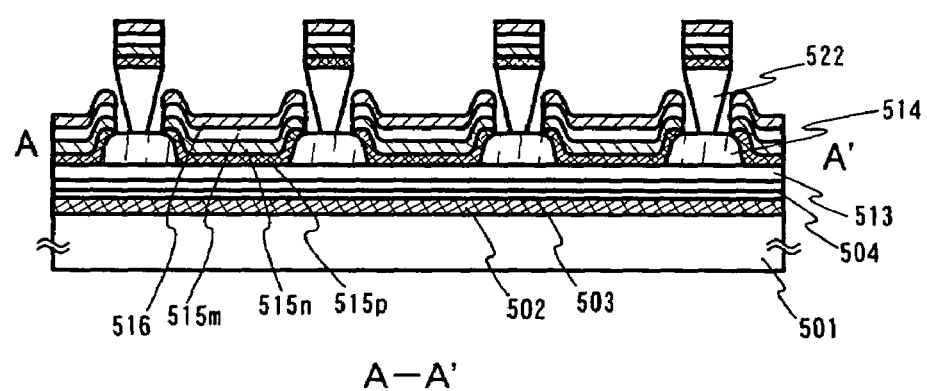
FIG. 2B

SEMICONDUCTOR DEVICE WITH METAL OXIDES AND AN ORGANIC COMPOUND

BACKGROUND OF THE INVENTION

1. Field of the Invention

The present invention relates to a semiconductor device which stores data.

The present invention relates to a semiconductor device that includes a memory element and a circuit, which includes a thin film transistor (hereinafter referred to as a TFT), and a manufacturing method thereof.

It is to be noted that a semiconductor device in the present specification corresponds to a semiconductor device that can function as a general device by use of semiconductor characteristics, and electro-optical devices, semiconductor circuits, and electronic devices can all be considered semiconductor devices.

2. Description of the Related Art

Individual identification technology using semiconductor devices in which data is exchanged by wireless communication has been attracting attention in recent years. Individual identification technology using semiconductor devices has started to be utilized in production, management, or the like of individual objects and has started to be applied to authentication of individual people. This kind of semiconductor device is also called an RFID (Radio Frequency IDentification) tag, an IC (Integrated Circuit) tag, an IC chip, an RF tag, a wireless tag, and an electronic tag.

A semiconductor device typified by an RFID tag includes a memory element for storing information, and the data stored in the memory element can be exchanged between the RFID tag and an external reader device (also referred to as a reader) by wireless communication.

With respect to RFID devices equipped with these kinds of semiconductor memory elements, improvements in memory storage capacity have been desired in recent years. Because there are limitations on the extent to which memory storage capacity can be expanded using so-called electronically addressable active matrix elements in which one memory cell is installed per switching element, passive matrix elements with a simpler structure are needed. For these kinds of electronically addressable passive matrix elements, organic memory elements using conjugated polymers have been disclosed in Patent Document 1: Japanese Published Patent Application No. 2001-503183.

SUMMARY OF THE INVENTION

In a passive matrix element, a plurality of extremely fine first conductors, each having a width from several tens of nanometers to several micrometers, is formed over a substrate and functions as an electric address line. A memory element material is formed over these first conductors. Second conductors are formed in a plane parallel to that of the first conductors, and the first conductor and the second conductor are provided perpendicular to each other so that the portion in which the first conductors overlap with the second conductors form a matrix. The portion where the first conductor overlaps with the second conductor functions as a memory cell.

Because a passive matrix element has such a simple structure, a high level of integration of a memory cell in a passive matrix element becomes potentially possible.

However, there is a serious problem with passive matrix elements that needs to be solved. That is, in a passive matrix element, prevention of so-called crosstalk is critical for normal operation of a memory device. However, there is a problem in that preventing crosstalk is technically difficult. Below, a mechanism for generation of crosstalk will be described using FIG. 10.

For reading of an electrically designated address of a memory element, reading of stored information is performed by reading of the resistance or the amount of change in the resistance of a memory cell. That is, when the same voltage is applied to a memory cell to which data has been written and to a memory cell to which no data has been written so that the stored data is read, the large difference in current between the memory cell to which data has been written and the memory cell to which no data has been written is read. Preferably, the difference in current is as large as possible, and, more preferably, the difference in current between that of the memory cell before data has been written and that of the memory cell after data has been written should equal 1000 times the initial value or more. In other words, for a memory device in which an electrically designated address is read, the difference in resistance between memory cells in which different information is stored, that is, the difference in resistance between a memory cell to which data has been written and a memory cell to which no data has been written is equal to 1000 times the initial value or more.

Here, an example is shown using a memory device in which the resistance of the memory cell decreases after information is written to the memory device. In FIG. 10, a simplified model diagram of a memory device is shown. This figure shows a memory device in which three mutually parallel first wirings n(l−1), n(l), and n(l+1) are arranged. A memory element material is formed over these first wirings, and three second wirings m(k−1), m(k), and m(k+1) are formed over the memory element material. In FIG. 10, a state is shown in which nine memory cells, with each memory cell formed in a portion in which one of the first wirings overlaps with one of the second wirings, are arranged in matrix.

As shown in FIG. 10, although writing of data to the memory cell n(l)m(k) is attempted after data has been written to the three memory cells n(l+1)m(k), n(l)m(k−1), and n(l+1)m(k−1), data cannot be stored in the memory cell n(l)m(k). This is because the resistance of the memory cell n(l)m(k) is more than 1000 times as much as that of neighboring memory cells to which data has been written. Thus, even if a voltage is applied to the first wiring n(l) and to the second wiring m(k), the resistance of the path along the dotted line in FIG. 10 is about one thousandth that of the memory cell n(l)m(k), which inhibits current from flowing to the target memory cell n(l)m(k), so data cannot be written thereto.

This kind of crosstalk problem can be solved, in theory, by provision of a rectification characteristic for each memory cell to which data has been written; however, this is yet to be realized. In Patent Document 1, it is disclosed that rectification characteristics can be obtained by use of an organic polymer for a memory element material. However, no macromolecular material is known of which rectification characteristics can be retained even after data has been written, that is, after current begins to flow. Furthermore, no molecular structure of a material displaying this kind of characteristic is disclosed in Patent Document 1.

In the present invention, a memory element structure is disclosed that includes a pair of electrodes, a layer that contains an organic compound interposed between the pair of electrodes, and, furthermore, two kinds of metal oxide layers provided between the pair of electrodes. One of the two kinds of metal oxide layers is a p-type semiconductor material, and the other is an n-type semiconductor material.

For a metal oxide layer that functions as a p-type semiconductor material (also referred to as a p-type metal oxide layer), nickel oxide doped with lithium oxide, cobalt oxide doped with lithium oxide, iron oxide doped with lithium oxide, manganese oxide doped with lithium oxide, bismuth oxide doped with barium oxide, chromium oxide doped with magnesium oxide, lanthanum chromite doped with strontium oxide, lanthanum manganite doped with strontium oxide, or the like can be given. In addition, for a p-type metal oxide layer, more than one kind of any of these materials listed above may be selected.

Furthermore, for a metal oxide layer that functions as an n-type semiconductor material (also referred to as an n-type metal oxide layer), zinc oxide doped with aluminum oxide, titanium oxide doped with tantalum oxide, iron oxide doped with titanium oxide, barium titanate doped with lanthanum oxide or tantalum oxide, tin oxide doped with antimony oxide, potassium oxide doped with titanium oxide, or the like can be given. In addition, for an n-type metal oxide layer, more than one kind of any of these materials listed above may be selected.

As shown in an example illustrated in FIG. 1A, a component of the invention disclosed in the present specification is a semiconductor device that includes a first electrode, a layer that contains a first metal oxide over the first electrode, a layer that contains a second metal oxide over the layer that contains the first metal oxide, a layer that contains an organic compound over the layer that contains the second metal oxide, and a second electrode over the layer that contains an organic compound.

In addition, a structure having a rectifying diode connected in series to the layer that contains an organic compound can be obtained by stacking of the two kinds of metal oxide layers placed between the pair of electrodes in such a way that a diode junction is formed. For example, a p-n junction can be formed by provision of the p-type metal oxide layer on the side close to the anode electrode and the n-type metal oxide layer on the side close to the cathode electrode.

Furthermore, as in an example shown in FIG. 1B, the layer that contains the first metal oxide and the layer that contains the second metal oxide may be formed over the layer that contains an organic compound in such a way that a p-n junction is formed. Another structure of the invention is a semiconductor device that includes a first electrode, a layer that contains an organic compound over the first electrode, a layer that contains a first metal oxide over the layer that contains an organic compound, a layer that contains a second metal oxide over the layer that contains the first metal oxide, and a second electrode over the layer that contains the second metal oxide, where the layer that contains the first metal oxide and the layer that contains the second metal oxide form a p-n junction.

By adoption of the structures described above, a selected memory cell can be addressed electrically without any crosstalk occurring even if passive matrix memory devices are used, and the resistance of the memory cell can be changed dramatically. Alternatively, the film thickness of the organic layer can be partially changed, and, as a result, the resistance of the memory cell can be greatly changed. By writing of data to the addressed memory cell, an electrical path including a layered structure of the lower electrode, the n-type metal oxide layer, the p-type metal oxide layer, and the upper electrode or an electrical path including a layered structure of the upper electrode, the n-type metal oxide layer, the p-type metal oxide layer, and the lower electrode is formed. In these layered structures, a p-n junction is formed between the p-type metal oxide layer and the n-type metal oxide layer, whereby a rectification characteristic can be obtained. As a result, malfunction of the memory device caused by the aforementioned crosstalk can be eliminated, and a memory device with a high level of integration can be obtained.

In the structures shown in FIGS. 1A and 1B, the n-type metal oxide layer or the p-type metal oxide layer can be formed by a sputtering method, a CVD method, an evaporation method, or the like. For a formation method of the n-type metal oxide layer and p-type metal oxide layer, using the sputtering method or the CVD method is more preferable because the layer-formation time is shorter for those methods than for an evaporation method and because a greater variety of metal oxides can be used in those methods than with an evaporation method.

In addition, as demonstrated by the example shown in FIG. 1C, the layer that contains an organic compound may be interposed between the layer that contains the first metal oxide and the layer that contains the second metal oxide. For an alternative structure of the invention, the semiconductor device is one that includes a first electrode, a layer that contains a first metal oxide over the first electrode, a layer that contains an organic compound over the layer that contains the first metal oxide, a layer that contains a second metal oxide over the layer that contains an organic compound, and a second electrode over the layer that contains the second metal oxide.

By use of the structure in FIG. 1C, the film thickness of the organic compound layer changes by writing of data to the memory cell, whereby a structure is provided in which the p-type metal oxide layer and the n-type metal oxide layer come into partial contact with each other to form a p-n junction. As a result, a rectification characteristic is manifested. Consequently, the crosstalk problem is eliminated, and a memory device with a high level of integration can be provided.

In addition, the manufacturing method by which the above structure shown in FIG. 1C is realized is also one aspect of the invention. The manufacturing method includes steps of forming the first electrode over an insulating surface, forming the layer that contains the first metal oxide over the first electrode, forming the layer that contains an organic compound over the layer that contains the first metal oxide, forming the layer that contains the second metal oxide over the layer that contains an organic compound, and forming the second electrode over the layer that contains the second metal oxide.

After the layer that contains the first metal oxide and the layer that contains the second metal oxide are formed over a conductive film that functions as the first electrode, etching may be performed using the same mask. Forming stacked layers by a sputtering method performed consecutively a number of times is preferable because forming layers takes less time with a sputtering method than with an evaporation method.

A driving circuit may be arranged in the periphery of a memory portion in which a plurality of memory cells is arranged in an orderly fashion. In order to reduce the number of manufacturing steps, forming the memory portion and the driving circuit over the same substrate is preferable. Here, in the present invention, one memory cell includes a plurality of memory elements and wirings (or TFTs) and the like, and a plurality of memory cells is arranged in an orderly fashion in the memory portion of the semiconductor device.

In addition, to enable communication functions, an antenna may be formed over the same substrate as the driving circuit and the memory portion. The driving circuit and memory portion may be electrically connected to the antenna, whereby the semiconductor device of the invention can transmit and receive wireless signals. For circuits electrically connected to the antenna, for example, a writing circuit, a reading circuit, a sense amplifier, an output circuit, a buffer, and the like can be given.

The layer that contains the first metal oxide and the layer that contains the second metal oxide can be formed using a formation method, such as a sputtering method, an evaporation method, a metal organic chemical vapor deposition method (MOCVD method), or the like, performed in a vacuum chamber.

For a material of the layer that contains an organic material which is interposed between a pair of electrodes, a low molecular-weight material or a macromolecular material may be used. For example, for a material of the memory element, a material with a high hole-transporting property, such as one of the following, can be used: an aromatic amine compound (that is, a compound which has a benzene ring-nitrogen bond) such as 4,4'-bis[N-(1-naphthyl)-N-phenylamino]biphenyl (abbreviated designation: α-NPD), 4,4'-bis[N-(3-methylphenyl)-N-phenylamino]biphenyl (abbreviated designation: TPD), 4,4',4"-tris(N,N-diphenylamino)triphenylamine (abbreviated designation: TDATA), 4,4',4"-tris[N-(3-methylphenyl)-N-phenylamino]triphenylamine (abbreviated designation: MTDATA), N,N'-bis[4-[bis(3-methylphenyl)amino]phenyl]-N,N'-diphenyl-[1,1'-biphenyl]-4,4'-diamine (abbreviated designation: DNTPD), or the like; a phthalocyanine compound such as phthalocyanine (abbreviated designation: $H_2Pc$), copper phthalocyanine (abbreviated designation: CuPc), vanadyl phthalocyanine (abbreviated designation: VOPc), or the like; or the like. For another material, an organic compound with a high electron-transporting property can be used. For example, any of the following can be used: a metal complex that includes a quinoline skeleton or a benzoquinoline skeleton, such as tris(8-quinolinolato)aluminum (abbreviated designation: $Alq_3$), tris(4-methyl-8-quinolinolato)aluminum (abbreviated designation: $Almq_3$), bis(10-hydroxybenzo[h]-quinolinato)beryllium (abbreviated designation: $BeBq_2$), bis(2-methyl-8-quinolinolato)(4-phenylphenolato)aluminum (abbreviated designation: BAlq), or the like. Other types of materials that may be used include metal complexes that have an oxazole-based or thiazole-based ligand, such as bis[2-(2'-hydroxyphenyl)benzoxazolato]zinc (abbreviated designation: $Zn(BOX)_2$), bis[2-(2'-hydroxyphenyl)benzothiazolato]zinc (abbreviated designation: $Zn(BTZ)_2$), or the like; or the like. Furthermore, in addition to metal complexes, any of the following compounds can be used: 2-(4-biphenylyl)-5-(4-tert-butylphenyl)-1,3,4-oxadiazole (abbreviated designation: PBD), 1,3-bis[5-(p-tert-butylphenyl)-1,3,4-oxadiazol-2-yl]benzene (abbreviated designation: OXD-7), 3-(4-biphenylyl)-5-(4-tert-butylphenyl)-4-phenyl-1,2,4-triazole (abbreviated designation TAZ), 3-(4-tert-butylphenyl)-4-(4-ethylphenyl)-5-(4-biphenylyl)-1,2,4-triazole (abbreviated designation: p-EtTAZ), bathocuproine (abbreviated designation: BCP), or the like. Moreover, in the layer that contains an organic compound, not only an organic material but also an inorganic material may be used. Furthermore, when a macromolecular material is used as the material layer of the memory element, a vinyl polymer such as poly(N-vinylcarbazole) or the like; conjugated polymers such as polyarylenevinylenes, polyarylene ethynylenes, polyarylenes, polyacetylenes, polyanilines, polythiophenes, or the like; a copolymer of any of these polymers; a three-dimensionally cross-linked material of any of these polymers; or the like may be used.

In addition, for prevention of falsification or misuse of data, when an organic material or inorganic material that does not undergo a reversible phase change is used as a material of the layer that contains an organic compound of the memory element, writing of data to an individual memory cell is set to be performed once.

On the other hand, when an organic material (for example, bathophenanthroline (abbreviated designation: BPhen)) or an inorganic material (tellurium (Te), tellurium oxide, antimony (Sb), selenium (Se), bismuth (Bi), or the like) that does undergo a reversible phase change is used, rewriting of the memory cell can be performed multiple times.

By the present invention, a high-yield manufacturing process of a memory device is realized, and a semiconductor device using memory elements for which manufacturing costs per memory element are exceptionally low can be provided. In addition, a semiconductor device using memory devices with a high level of integration can be provided.

BRIEF DESCRIPTION OF THE DRAWINGS

FIGS. 2A to 2C are top-view and cross-sectional view diagrams of a passive matrix memory device. (Embodiment 1)

DETAILED DESCRIPTION OF THE INVENTION

Figure 1A:
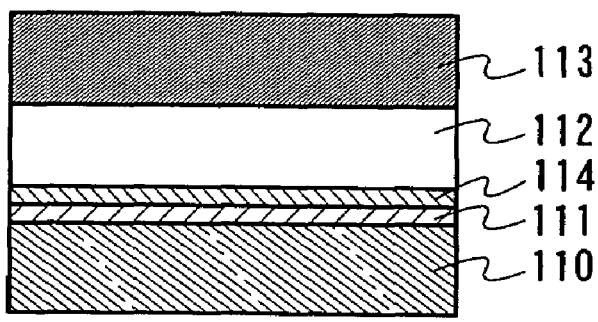
FIGS. 1A to 1C are diagrams illustrating a layered structure. (Embodiment Mode 1, Embodiment Mode 2, and Embodiment Mode 3)

Hereinafter, Embodiment Modes and Embodiments of the present invention will be described based on drawings. However, the present invention can be implemented in a lot of different modes, and it is to be easily understood by those skilled in the art that various changes and modifications can be made without any departure from the spirit and scope of the present invention. Accordingly, the present invention is not to be taken as being limited to the written content of the embodiment modes described herein. Note that identical portions or portions having similar functions in all figures for explaining embodiment modes and embodiments are denoted by the same reference numerals, and repetitive descriptions thereof are omitted.

Embodiment Mode 1

In the present embodiment mode, an example of a manufacturing method of a passive matrix memory device that has a plurality of memory elements over a glass substrate, which is one kind of a substrate that has an insulating surface, will be explained using FIG. 1A. FIG. 1A is a cross-sectional view schematic diagram of one memory element.

First, over a glass substrate, a first electrode 110 is formed as shown in FIG. 1A. The first electrode 110 can be formed as a single-layer or multilayer structure. Specifically, a film of elemental aluminum (Al), titanium (Ti), molybdenum (Mo), tungsten (W), a film of an alloy using one or more of any of these elements, a film of an alloy of one or more of any of these elements and silicon, or the like can be used. Alternatively, a light-transmitting material such as indium-tin oxide (ITO), indium-tin oxide containing silicon oxide, indium oxide containing from 2 wt % to 20 wt % of zinc oxide, or the like can also be used.

It is to be noted that, here, a partition may be provided to separate neighboring memory elements, that is, neighboring first electrodes 110.

Next, a first metal oxide layer 111 that functions as a p-type semiconductor material is formed over the first electrode 110, and a second metal oxide layer 114 that functions as an n-type semiconductor material is also formed thereover. By stacking of the first metal oxide layer 111 and the second metal oxide layer 114, a p-n junction diode is formed. In the present embodiment mode, the first electrode 110 functions as an anode of a diode. The first metal oxide layer 111 and the second metal oxide layer 114 can be formed using a formation method, such as a sputtering method, an evaporation method, a metal organic chemical vapor deposition method (MOCVD method), or the like, performed in a vacuum chamber.

Next, a layer 112 that contains an organic compound is formed over the second metal oxide layer 114. The layer 112 that contains an organic compound can be formed by an evaporation method, a spin coating method, a liquid droplet discharge method represented by an inkjet method, or the like.

Next, a second electrode 113 is formed over the layer 112 that contains an organic compound. This electrode is arranged in a plane parallel to the first electrode 110 so that these two electrodes 110 and 113 are perpendicular to each other. In the present embodiment mode, the second electrode 113 functions as a cathode of the diode. Furthermore, the second electrode or first electrode of the memory element functions as a word electrode or bit line.

In this way, a memory element, which includes stacked metal oxide layers that form a p-n junction and a layer that contains an organic compound over the stacked metal oxide layers interposed between the pair of electrodes, can be formed. By application of the structure shown in FIG. 1A, a p-n junction can be realized because the p-type metal oxide layer and the n-type metal oxide layer come into contact with each other. Consequently, even if there is a great change in the resistance of the memory element after writing has been performed or a great change in the resistance of the memory element resulting from a change in the film thickness of the organic compound layer, a rectification characteristic can be retained due to the existence of the p-n junction. Because of this, the crosstalk problem can be solved, and a memory device with a higher level of integration can be provided.

In the present embodiment mode, an example is given in which the first metal oxide layer and second metal oxide layer are formed after the partition is formed. However, the present invention is not limited to this structure, and the partition may be formed after the first metal oxide layer is formed over the first electrode, or the partition may be formed after the first metal oxide layer and second metal oxide layer are formed over the first electrode. In addition, the partition need not necessarily be formed.

Embodiment Mode 2

In Embodiment Mode 1, an example is given of a memory element in which metal oxide layers are stacked to form a p-n junction and a layer containing an organic compound over the stacked layers. In the present embodiment mode, an example will be given of a memory element that has a first metal oxide layer and a second metal oxide layer stacked over a layer that contains an organic compound in such a way that a p-n junction is formed.

Figure 1B:
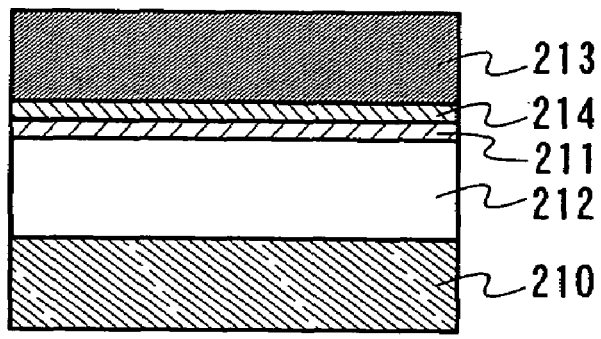

First, over a glass substrate, as in Embodiment Mode 1, a first electrode 210 is formed as shown in FIG. 1B.

Next, a partition is provided to separate neighboring memory elements, that is, neighboring first electrodes 210. In the present embodiment mode, the partition is provided; however, the partition need not necessarily be used.

Next, a layer 212 that contains an organic compound is formed over the first electrode 210. The layer 212 that contains an organic compound can be formed by an evaporation method, a spin coating method, a liquid droplet discharge method represented by an inkjet method, or the like.

Next, a first metal oxide layer 211 that functions as a p-type semiconductor material is formed over the layer 212 that contains an organic compound, and, further, a second metal oxide layer 214 that functions as an n-type semiconductor material is formed thereover. A p-n junction diode is formed by the stacking of the first metal oxide layer 211 and the second metal oxide layer 214, and in the present embodiment mode, the first electrode 210 functions as an anode of the diode.

In the present embodiment mode, the layer 212 that contains an organic compound is formed before the first metal oxide layer 211 and the second metal oxide layer 214 are formed. Because of this, it is preferable that the first metal oxide layer 211 and the second metal oxide layer 214 be formed by a formation method and under formation conditions in which the layer 212 that contains an organic compound is not significantly damaged.

Next, a second electrode 213 is formed over the second metal oxide layer 214. In the present embodiment mode, the second electrode 213 functions as a cathode of the diode. In addition, the second electrode or first electrode of a memory element functions as a word electrode or bit line.

In this way, a memory element, which includes a layer that contains an organic compound and stacked metal oxide layers that form a p-n junction over the layer that contains an organic compound all interposed between the pair of electrodes, can be formed. By application of the structure shown in FIG. 1B, a structure can be configured as one in which a p-type metal oxide layer and an n-type metal oxide layer come into contact with each other. That is, a p-n junction can be formed by the metal oxide layers. Consequently, even if there is a great change in the resistance of the memory element after writing has been performed or a great change in the resistance of the memory element resulting from a change in the film thickness of the organic compound layer, the p-n junction can be preserved, whereby rectification characteristics can be retained. Because of this, the crosstalk problem can be solved, and a memory device with a higher level of integration can be provided.

Note that the present embodiment mode can be freely combined with Embodiment Mode 1.

Embodiment Mode 3

In the present embodiment mode, an example of a memory element is shown in which a layer that contains an organic compound is provided over a first metal oxide layer, and a second metal oxide layer is provided over the layer that contains an organic compound.

Figure 1C:
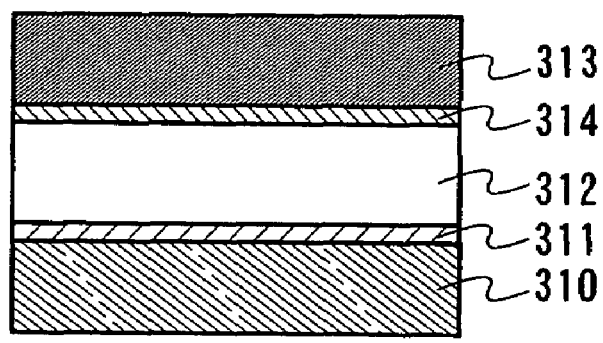

First, over a glass substrate, as in Embodiment Mode 1, a first electrode 310 is formed as shown in FIG. 1C.

Next, a partition is provided to separate neighboring memory elements, that is, neighboring first electrodes 310.

Next, a first metal oxide layer 311 that functions as a p-type semiconductor material is formed over the first electrode 310.

Then, a layer 312 that contains an organic compound is formed over the first metal oxide layer 311.

After that, a second metal oxide layer 314 that functions as an n-type semiconductor material is formed over the layer 312 that contains an organic compound.

In the present embodiment mode, because the layer 312 that contains an organic compound is formed before the second metal oxide layer 314, it is preferable that the second metal oxide layer 314 be formed by a formation method and under formation conditions in which the layer 312 that contains an organic compound does not receive a significant amount of damage.

Next, a second electrode 313 is formed over the second metal oxide layer 314. The second electrode or first electrode for a memory element functions as a word electrode or bit line.

In this way, between the pair of electrodes, a memory element, including a first metal oxide layer, a layer that contains an organic compound, and a second metal oxide layer, where the layer that contains an organic compound is interposed between the first metal oxide layer and the second metal oxide layer, can be formed. By application of the structure in FIG. 1C, when performance of the writing operation brings about a change in film thickness of the organic compound layer so that the structure of the memory element becomes one in which the p-type metal oxide layer and the n-type metal oxide layer come into contact with each other, a p-n junction is formed, whereby a rectification characteristic can be obtained. Because of this, the crosstalk problem can be solved, and a memory device with a higher level of integration can be provided.

In the present embodiment mode, an example is shown in which the first metal oxide layer is formed after the partition is formed. However, the present invention is not limited to this structure, and the partition may be formed after the first metal oxide layer is formed over the first electrode, or the partition need not be formed.

Note that the present embodiment mode can be freely combined with Embodiment Mode 1 and Embodiment Mode 2.

A more detailed description of the present invention including the above structures will be given in the embodiments presented hereinafter.

Embodiment 1

Here, examples of manufacturing of a passive matrix memory device over a flexible substrate will be described using FIGS. 2A to 2C, FIG. 3, and FIGS. 4A and 4B.

A passive (simple matrix) memory device has a structure in which a plurality of bit lines is arranged in parallel in a striped form (in strips) and a plurality of word lines is arranged in parallel in a striped form. This plurality of bit lines and this plurality of word lines are mutually perpendicular to each other, and a material layer is sandwiched by a bit line and word line at each intersection of the plurality of bit lines and the plurality of word lines. Consequently, a reading operation or writing operation of a memory cell is performed at an intersection of a selected (one to which a voltage has been applied) bit line and a selected word line.

First, a metal layer 502 that acts as a peeling layer is formed over a substrate 501. An insulating substrate such as a glass substrate or the like is used for the substrate 501. For the metal layer 502, a tungsten film or molybdenum film with a thickness of from 30 nm to 200 nm obtained by a sputtering method is used.

Next, the surface of the metal layer 502 is oxidized to form a metal oxide layer 503. The metal oxide layer 503 may be formed by oxidation of the surface of the metal layer 502 using pure water or ozone water or by oxidation of the surface of the metal layer 502 with oxygen plasma. Alternatively, the metal oxide layer 503 may be formed by heat treatment of the metal layer 502 in an atmosphere that contains oxygen. Furthermore, the metal oxide film may be formed during a later step in which an insulating layer is formed. In this case, when a silicon oxide film or silicon nitride film acting as an insulating film is formed by a plasma CVD method, the surface of the metal layer 502 is oxidized, whereby the metal oxide layer 503 is formed.

Next, an insulating film 504 is formed over the metal oxide layer 503. For the insulating film 504, an insulating film such as a silicon oxide film, a silicon nitride film, a silicon oxynitride film ($SiO_xN_y$, (x>y)), or the like is used. A typical insulating film 504 has a two-layer structure, and a structure is often employed in which a silicon nitride oxide film with a thickness of from 50 nm to 100 nm formed by a PCVD method using $SiH_4$, $NH_3$, and $N_2O$ as the reactive gas and a silicon oxynitride film with a thickness of from 100 nm to 150 nm formed by a PCVD method using $SiH_4$ and $N_2O$ as the reactive gas are stacked together. Using a silicon nitride film (an SiN film) or a silicon nitride oxide film (an $SiN_xO_y$ film (x>y)) with a thickness of 10 nm or less as one of the layers of the insulating film 504 is preferable. In addition, a three-layer structure of a silicon nitride oxide film, a silicon oxynitride film, and a silicon nitride film, stacked in this order, may be used. Here, an example is shown in which the insulating film 504 is formed as a base insulating film. However, the insulating film 504 need not be provided unless there is some particular need for it.

Next, a plurality of first electrodes 513 is formed over the insulating film 504. The plurality of first electrodes 513 is arranged in a striped form.

Then, a partition 514 that has openings each corresponding to a memory element is provided. The partition 514 that has openings is formed of an insulating material (a photosensitive or non-photosensitive organic material (polyimide, an acrylic polymer, polyamide, polyimide amide, or a benzocyclobutene-based resin) or an SOG film (an $SiO_x$ film that contains an alkyl group)).

After that, a plurality of reverse-tapered partitions 522 is provided over the partition 514 that has openings so as to intersect with the first electrode 513 and so that all of the reverse-tapered partitions 522 are mutually parallel. The reverse-tapered partitions 522 are formed by a photolithography method using a positive photosensitive resin in which a part not exposed to light is not dissolved by solution but is left remaining as a pattern. The amount exposed to light and time for developing are adjusted so that the lower part of the pattern is etched more rapidly.

Figure 3:
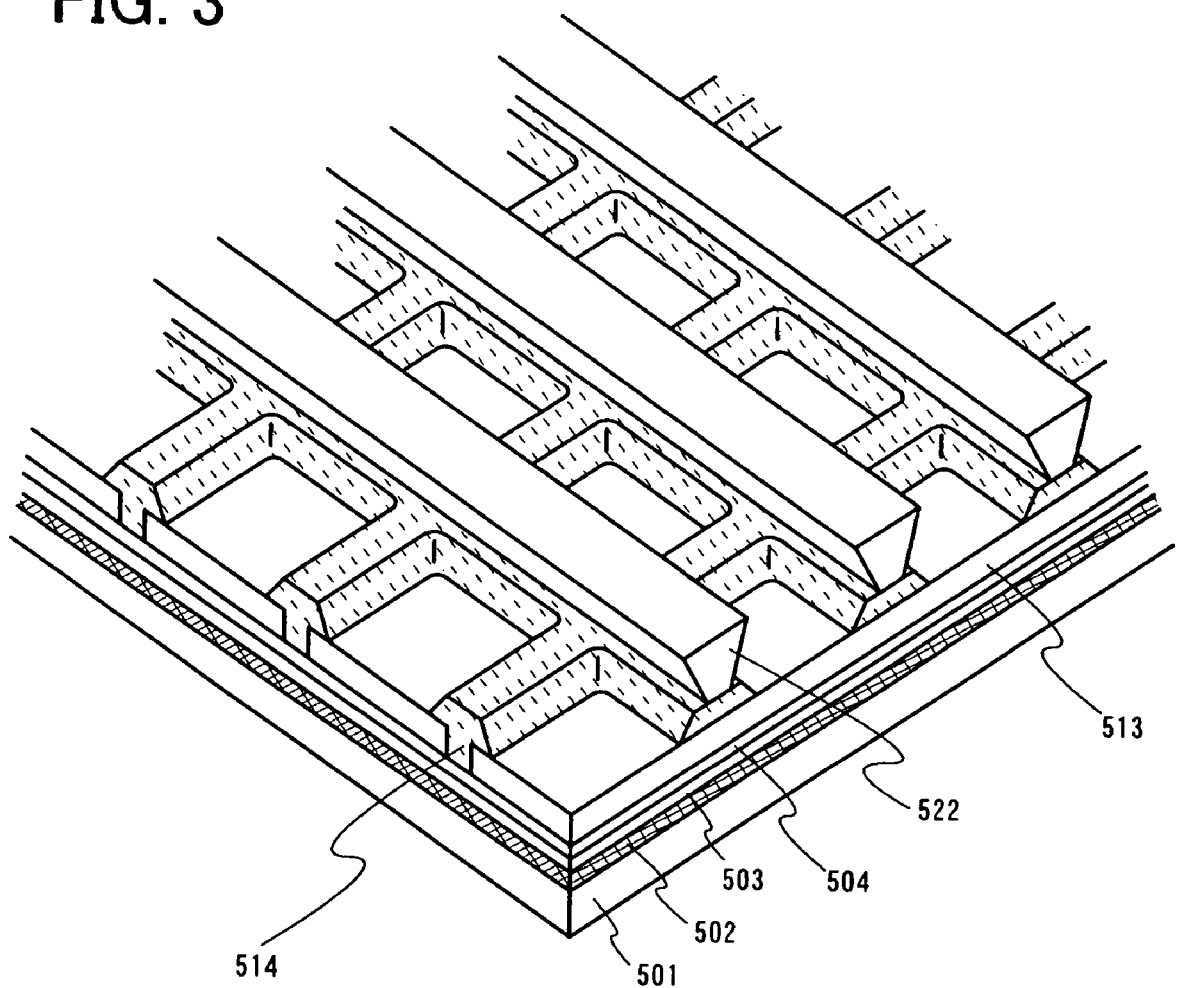
FIG. 3 is a perspective-view diagram of a passive matrix memory device at a point midway through the manufacturing process. (Embodiment 1)

A perspective diagram illustrating the passive memory device at a point immediately after the plurality of mutually parallel reverse-tapered partitions 522 is formed is shown in FIG. 3.

The height of the reverse-tapered partitions 522 is set to be higher than the total height of a stacked film that includes an organic compound layer and a second electrode that are formed after the partitions 522.

Next, a first metal oxide layer 515p that functions as a p-type semiconductor material, a second metal oxide layer 515n that functions as an n-type semiconductor material, a layer 515m that contains an organic compound, and a second electrode 516 are formed and stacked, in that order, over the first electrode. In the present embodiment, these stacked layers are formed in succession by an evaporation method in which the memory device is not exposed to the atmosphere. The first metal oxide layer 515p, the second metal oxide layer 515n, the layer 515m that contains an organic compound, and the second electrode 516 are separated into a plurality of electrically independent regions by the reverse-tapered partitions 522. The second electrode 516 is separated into a plurality of regions and extends in a direction of intersection with the first electrode 513 in striped form so that the plurality of regions is mutually parallel. It is to be noted that stacked films including layers that each include an organic compound as well as conductive films are also formed over the reverse-tapered partitions 522. However, the films stacked over the reverse-tapered partitions are electrically isolated from the first metal oxide layer 515p, second metal oxide layer 515n, layer 515m that contains an organic compound, and second electrode 516 that are formed over the first electrode.

FIG. 2A is a top-view diagram of a passive memory device obtained by the above steps, FIG. 2B is a cross-sectional view diagram of a cross section taken along the dashed-dotted line A-A' in FIG. 2A, and FIG. 2C is a cross-sectional view diagram of a cross section taken along the dashed-dotted line B-B' in FIG. 2A. It is to be noted that the same numerals are used for the same parts in FIGS. 2A to 2C as were used in FIG. 3.

Figure 4A:
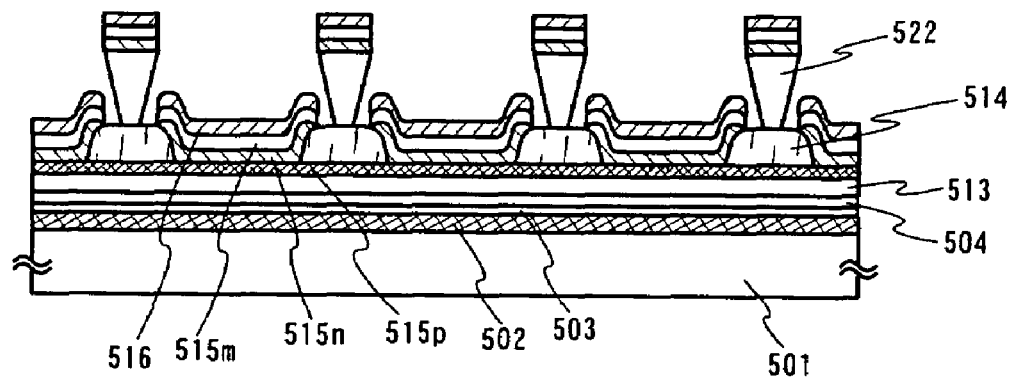
FIGS. 4A and 4B are cross-sectional view diagrams illustrating a memory device. (Embodiment 1)
Figure 4B:
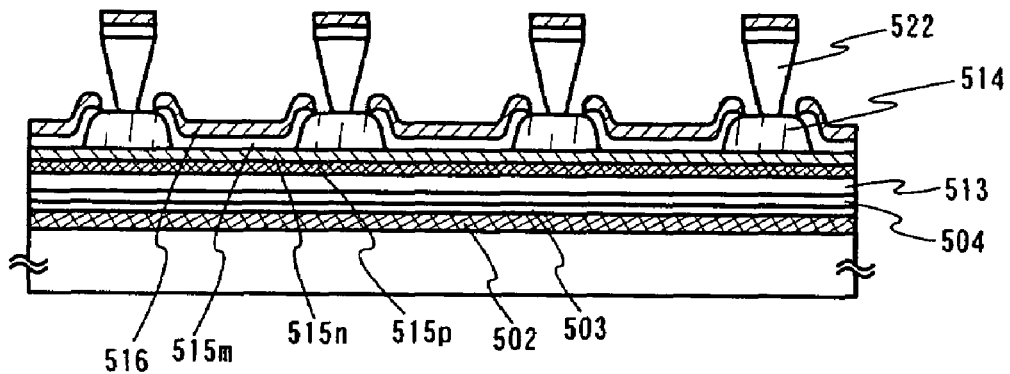

In the present embodiment, an example is shown in which the first metal oxide layer 515p and the second metal oxide layer 515n are formed after the partition 514 is formed; however, the present invention is not limited to this structure. For example, as in an example shown in FIG. 4A, the partition 514 may be formed after the first metal oxide layer 515p is formed over the first electrode 513. Alternatively, as shown in FIG. 4B, the partition 514 may be formed after the first metal oxide layer 515p and the second metal oxide layer 515n are formed over the first electrode 513. It is to be noted that the same numerals are used for the same parts in FIGS. 4A and 4B as were used in FIGS. 2A to 2C and FIG. 3.

Furthermore, an integrated circuit enabling transmission and reception using wireless signals may be formed over the same substrate as the passive-type memory device. If the integrated circuit is formed over the same substrate as the passive-type memory device, it is preferable that the integrated circuit using TFTs or the like or an antenna be formed over a glass substrate before the passive-type memory device is formed. Moreover, the antenna may be formed after the passive-type memory device is formed. It is to be noted that, when the integrated circuit is formed over the same substrate as the passive-type memory device, it is desirable that a driving circuit for the passive-type memory device also be formed over the same substrate.

Next, a first flexible substrate is affixed to the second electrode 516 by use of an adhesive layer, double-sided tape, or the like so as to face the substrate 501.

Then, the metal layer 502 and substrate 501 are separated from the memory cell 521 and first flexible substrate. There are no particular limitations on the place at which they are separated as long as it lies in a region from the first electrode 513 to the substrate 501 where the memory cell is not damaged. The metal layer 502 and substrate 501 may be separated from the memory cell 521 and the first flexible substrate at a place within a metal layer or within a metal oxide layer, at an interface between the substrate and the metal layer, or at an interface between the first electrode 513 and the metal oxide layer 503.

Next, the surface exposed by the peeling process (an exposed surface of the first electrode 513 or an exposed surface of the metal oxide layer 503) is attached to a second flexible substrate so as to face the first flexible substrate, and stacked layers that contain memory cells are transposed to the second flexible substrate.

In this way, a passive matrix memory device can be manufactured over a flexible substrate. In order to connect an IC used for driving or an FPC, if necessary, a part of the adhesive layer that makes contact with the first flexible substrate and the substrate may be removed. It is to be noted that, when an antenna or an integrated circuit with which signals can be transmitted and received is provided over the same substrate as the passive matrix memory device, power supply voltage and logic signals for driving the memory device can be generated from wireless signals received by the antenna. Because of this, there is no need to remove a part of the first flexible substrate or provide an external terminal; therefore, manufacturing the device according to the above manufacturing process is preferable.

The present embodiment can be freely combined with Embodiment Mode 1, Embodiment Mode 2, and Embodiment Mode 3.

Embodiment 2

In the present embodiment, a structure of a memory device in which a plurality of memory elements formed in any of Embodiment Modes 1 through 3 is arranged in matrix and a data writing method will be described.

Figure 5A:
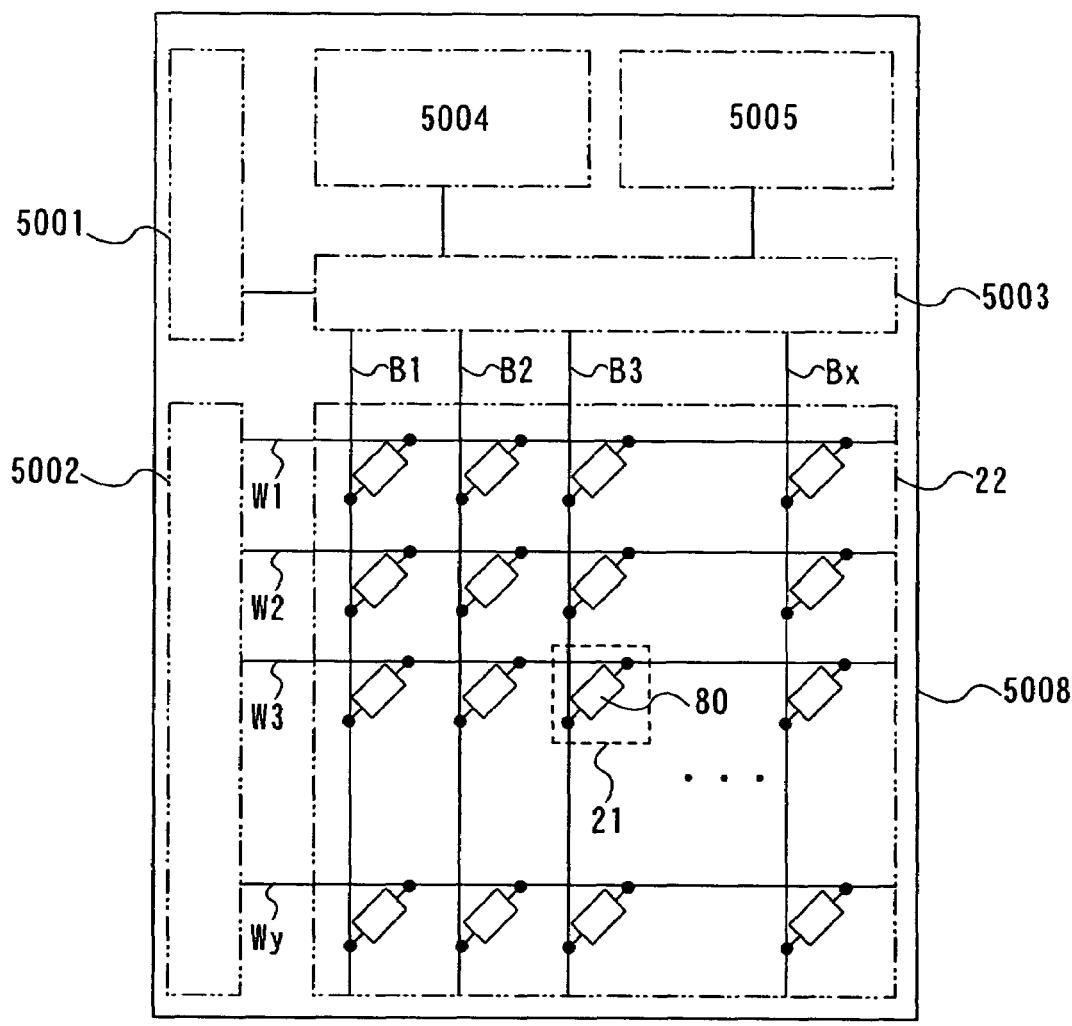
FIGS. 5A and 5B are diagrams illustrating a circuit configuration of a memory device. (Embodiment 2)

In FIG. 5A, $W_n$ ($1 \leq n \leq y$) designates a word line $W_n$, and $B_m$ ($1 \leq m \leq x$) designates a bit line $B_m$.

In FIG. 5A, a structure of a memory device of the present invention is shown. A memory device 5008 of the present invention includes a column decoder 5001, a row decoder 5002, a reading circuit 5004, a writing circuit 5005, a selector 5003, and a memory cell array 22. The memory cell array 22 includes a plurality of memory cells 21.

The memory cell 21 includes one memory element 80. The memory element 80 includes a word line and a bit line and also includes a layer that contains an organic compound, a first metal oxide layer that functions as a p-type semiconductor material, and a second metal oxide layer that functions as an n-type semiconductor material between the word line and bit line. This memory element 80 may be formed using any one of the methods described in Embodiment Modes 1 through 3.

It is to be noted that the structure shown here is merely one example, and the semiconductor device 5008 may also include additional circuits such as a sense amplifier, an output circuit, a buffer, or the like, and the writing circuit may be provided in a bit line driving circuit.

The column decoder 5001 receives address signals designating a column of the memory cell array and feeds a signal to the selector 5003 for the designated column. The selector 5003 receives the signal from the column decoder 5001 and selects a bit line of the designated column. The row decoder 5002 receives address signals designating a row for the memory cell array and selects a word line of the designated row. One of the memory cells 21 is selected in response to the address signals by the above operations. The reading circuit 5004 reads data included in the selected memory cell and amplifies and outputs the data. The writing circuit 5005 generates a voltage required for writing, and by application of the voltage to the memory element of the selected memory cell, writing of data is performed.

Figure 5B:
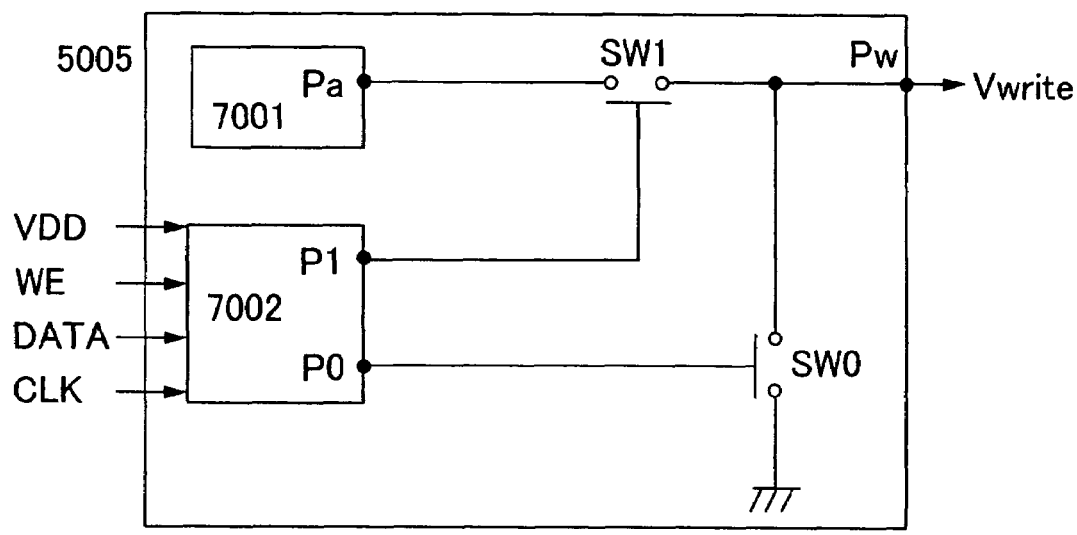

In FIG. 5B, a structure of the writing circuit 5005 included in the memory device is shown. The writing circuit 5005 includes a voltage generating circuit 7001, a timing control circuit 7002, switches SW0 and SW1, and an output terminal Pw. The voltage generating circuit 7001 is configured with a voltage amplifier circuit and the like, generates a voltage V1 required for writing, and outputs the voltage V1 from an output terminal Pa. The timing control circuit 7002 generates a signal S0 and a signal S1 that control the switch SW0 and the switch SW1, respectively, from a writing control signal (written as WE), a data signal (written as DATA), a clock signal (written as CLK), and the like and outputs the signal S0 and the signal S1 from an output terminal P0 and an output terminal P1, respectively. The switch SW0 controls connections to earth ground, and the switch SW1 controls connections to the output terminal Pa of the voltage generating circuit 7001. Depending on how the connection states for these switches are set, the output of the writing circuit can be set to be an output voltage Vw from the output terminal Pw Next, writing operations will be described. Here, the initial state, that is, the state in which no data is written, of the memory element is defined as "0". The state in which data is written is the state in which the memory cell to which no data is written is short-circuited and is defined as "1". By short-circuiting of the memory cell to which no data is written, the conductivity of the memory cell changes dramatically. First, the input signal WE is set to High, the column decoder 5001, which receives an address signal designating a column, feeds a signal to the selector 5003 of the designated column, and the selector 5003 connects the bit line of the designated column to the output terminal Pw of the writing circuit. Undesignated bit lines are placed in an unconnected (referred to as floating) state, and the output voltage Vw of the writing circuit comes to be V1. Similarly, the row decoder 5002, which receives an address signal designating a row, applies the voltage V2 to the word line of the designated row and applies 0 V to undesignated word lines. Through the above operations, one of the memory elements 80 is selected according to the address signal. At this time, 0 V are applied to the non-selected word line electrodes.

By reception of an input signal DATA=High, simultaneously, the voltage generating circuit 7001 generates a voltage V1 and outputs the voltage V1 from the output terminal Pa. The timing control circuit 7002 generates the signal S0 and the signal S1 for controlling the switch SW0 and the switch SW1, respectively, from the input signals WE, DATA, CLK, a power supply voltage (VDD) and the like and outputs the signals from the output terminals P0 and P1. According to the signals, each of the switches SW0 and SW1 is switched the other way, whereby the writing circuit 5005 can output the voltage V1 for the output voltage Vw from the output terminal Pw.

For the selected memory element, through the above operations, a voltage V2 is applied to a word line, a voltage V1 is applied to a bit line, and 0 V is applied to non-selected word lines. As a result, the bit line voltage V1 is applied to the memory element, whereby the memory element is short-circuited. Because the conductivity of the memory element changes dramatically, data of "1" is stored in the memory element.

Moreover, when the input signal WE becomes Low (a low voltage at which writing is prohibited), the voltage for all word lines becomes 0 V, and all bit lines (the first conductive layer) and the word line electrodes (the second conductive layer) come to be in a floating state. At this time, the timing control circuit 7002 sets each of the signals S0 and S1 to Low and outputs the signals from the output terminals P0 and P1, whereby the output terminal Pw comes to be in a floating state. By the above operations, writing comes to be performed.

Next, writing of "0" will be explained. Writing of "0" is a writing operation in which the conductivity of the memory element is not changed, which means that voltage is not applied to the memory element. That is, writing of "0" can be realized if the initial state is retained. First, similar to the case in which data of "1" is written, when the input signal WE comes to be High (a high voltage at which writing can be performed), the column decoder 5001, which receives address signals designating the column, feeds a signal to the designated selector, and the selector 5003 connects the designated column of the bit line to the output terminal Pw of the writing circuit. Bit lines not selected at this time come to be in a floating state. Similarly, the row decoder 5002, which receives address signals designating a row, applies the voltage V2 to the designated word line and 0 V to non-designated word lines. One of the memory elements 80 is selected in response to address signals by the above operations. At this time, 0 V are applied to the word line.

Simultaneously, the timing control circuit 7002 receives the input signal DATA (DATA=Lo), generates the control signals S0 (S0=Hi) and S1 (S1=Lo), and outputs the control signal S0 and the control signal S1 from the output terminal P0 and the output terminal P1, respectively. The switch SW0 is turned on and the switch SW1 is turned off by the control signals, and 0 V are output for the output voltage Vw from the output terminal Pw.

For the selected memory cell, V2 is applied to the word line and 0 V are applied to the bit line, according to the above operations. Since no voltage is applied to the memory element, the conductivity is not changed, and the initial state of "0" is retained.

When the input signal WE comes to be Low, the voltage for all word lines comes to be 0 V, and all bit lines and the word lines come to be in a floating state. Simultaneously, the timing control circuit sets the signals S0 and S1 to Low, and the signal S0 and the signal S1 are output from the output terminal P0 and the output terminal P1, respectively, whereby the output terminal Pw comes to be in a floating state.

In this way, writing of "1" and "0" can be performed.

Next, reading of data will be explained.

Figure 6:
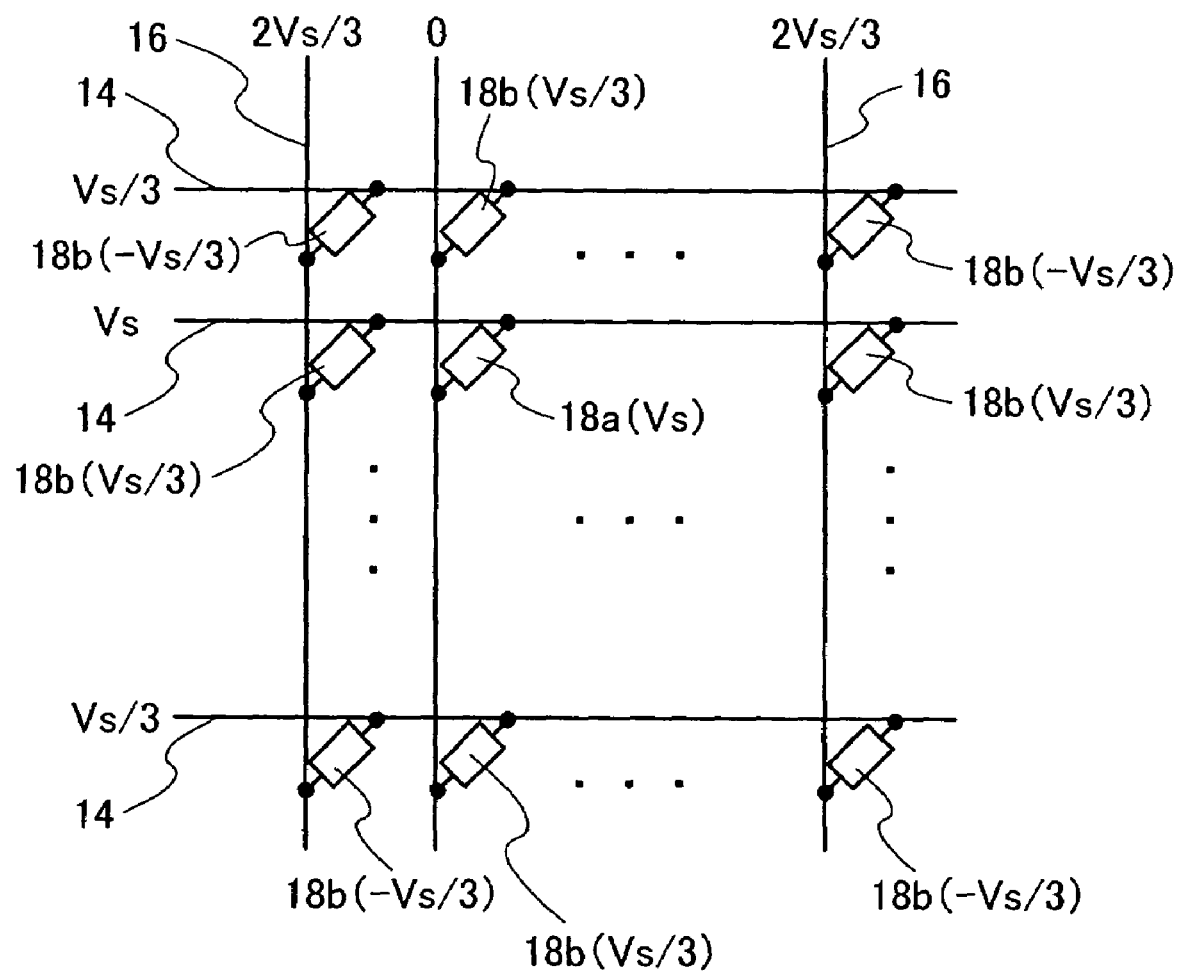
FIG. 6 is a circuit diagram used for explaining a data reading operation. (Embodiment 2)

In FIG. 6, "14" designates word lines, and "16" designates bit lines.

In FIG. 6, one selected memory cell 18*a* and non-selected cells 18*b* are shown. A potential Vs (word selection potential) is applied to the word line 14 and a potential 0 (bit selection potential) is applied to the bit line 16 connected to the selected memory cell 18 that is located at an address (2, 2). Consequently, a positive voltage of Vs−0=Vs is applied to the selected memory cell 18*a*, and the selected memory cell 18*a* comes to be in a polarized state by the above-mentioned reading operation. Therefore, as mentioned above, by detection of current of the bit line 16 connected to the selected memory cell 18*a*, whether the state of the memory element is "1" or "0" can be determined.

Note that the actual reading operation is executed for a plurality of memory cells on one of the word lines 14 simultaneously, and a collection of 8-bit data, 16-bit data, or the like is read simultaneously.

The present embodiment can be freely combined with Embodiment Mode 1, Embodiment Mode 2, Embodiment Mode 3, and Embodiment 1

Embodiment 3

Figure 7:
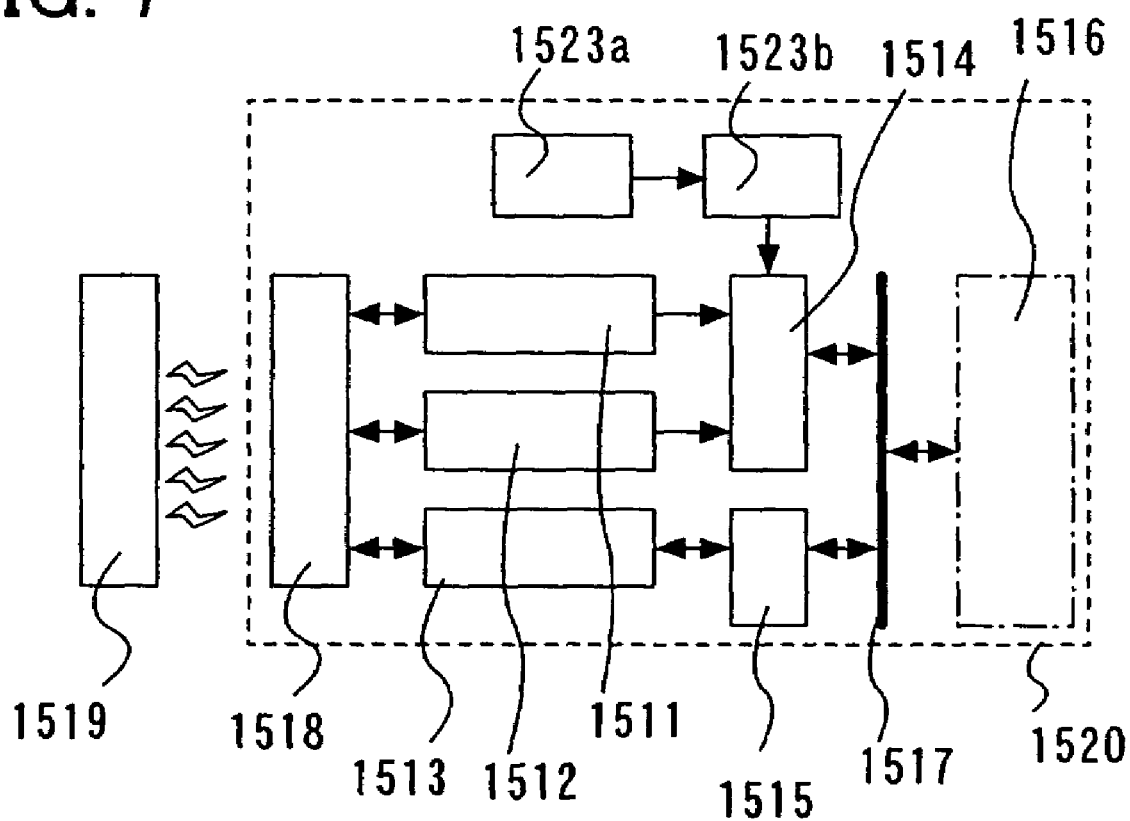
FIG. 7 is a diagram of an example of a structure of a semiconductor device of the present invention. (Embodiment 3)

A configuration of a semiconductor device of the present embodiment will be described with reference to FIG. 7. As shown in FIG. 7, a semiconductor 1520 of the present invention has a function for exchanging data wirelessly and includes a power supply circuit 1511, a clock generating circuit 1512, a data demodulation/modulation circuit 1513, a controller circuit 1514 used to control other circuits, an interface circuit 1515, a memory circuit 1516, a data bus 1517, an antenna 1518, a sensor 1523a, and a sensor circuit 1523b.

The power supply circuit 1511 generates a variety of power supply signals that are supplied to every internal circuit of the semiconductor device 1520 based on alternating current signals input from the antenna 1518. The clock generating circuit 1512 generates a variety of clock signals that are supplied to respective internal circuits of the semiconductor device 1520 based on alternating current signals input from the antenna 1518. The data demodulating/modulating circuit 1513 has a function of demodulating/modulating data exchanged with a reader/writer 1519. The controller circuit 1514 has a function of controlling the memory circuit 1516. The antenna 1518 has a function of transmitting and receiving electromagnetic waves. The reader/writer 1519 communicates with and controls the semiconductor device and controls the processing of data thereof. It is to be noted that the semiconductor device is not restricted to the above configuration; for example, the configuration may be one in which additional components, such as a power supply voltage limiter circuit or hardware used exclusively for cryptography, are included.

The memory circuit 1516 includes a memory element in which the properties of an insulating layer interposed between a pair of conductive layers change by an electrical operation from an external source or by irradiation with light. It is to be noted that the memory circuit 1516 may include only a memory element in which an insulating layer is interposed between a pair of conductive layers, or the memory circuit 1516 may include a memory circuit with another structure. A memory circuit with another kind of structure corresponds to one or a plurality of any of the following memory circuits selected from a DRAM circuit, an SRAM circuit, an FeRAM circuit, a mask ROM circuit, a PROM circuit, an EPROM circuit, an EEPROM circuit, or a flash memory circuit.

The sensor 1523a is formed of a semiconductor element, such as a resistive element, a capacitive-coupling element, an inductive-coupling element, a photovoltaic element, a photoelectric conversion element, a thermoelectric element, a transistor, a thermistor, a diode, or the like. The sensor circuit 1523b detects changes in impedance, reactance, inductance, voltage or current; converts signals from analog to digital (A/D conversion); and outputs signals to the controller circuit 1514.

The present embodiment can be freely combined with Embodiment Mode 1, Embodiment Mode 2, Embodiment Mode 3, Embodiment 1, and Embodiment 2.

Embodiment 4

Figure 8A:
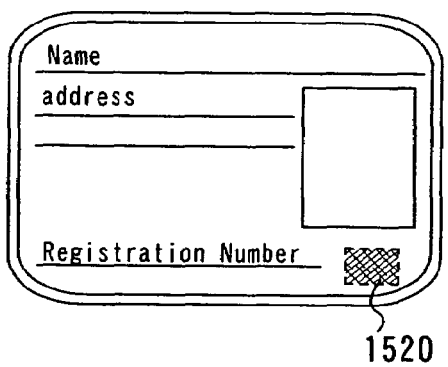
FIGS. 8A to 8F are diagrams illustrating usage modes for a semiconductor device of the present invention. (Embodiment 4)
Figure 8B:
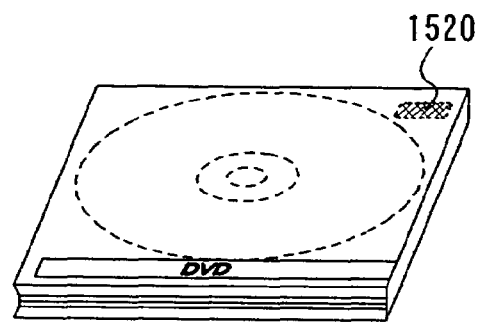
Figure 8C:
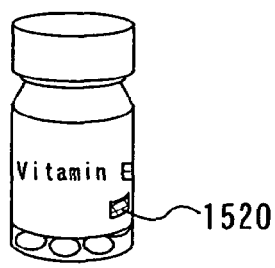
Figure 8D:
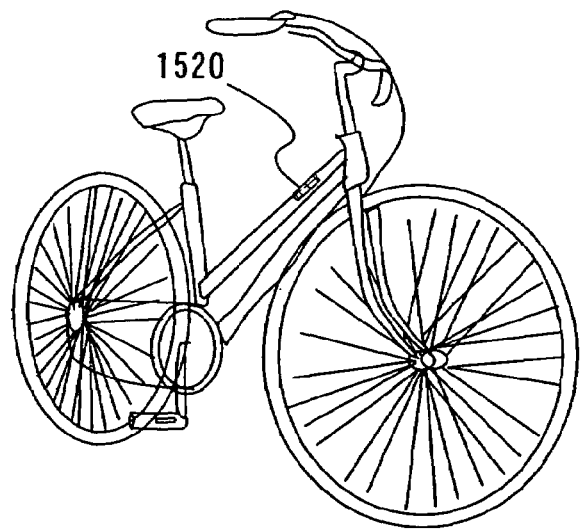
Figure 8E:
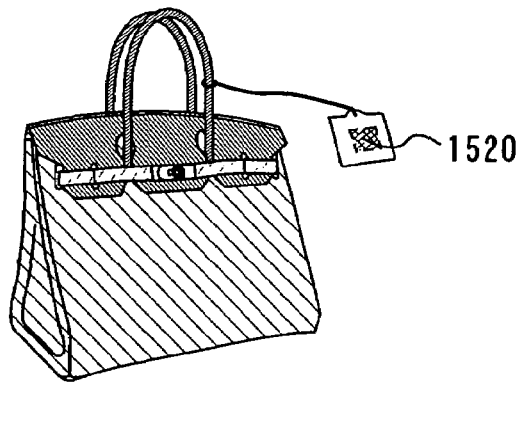
Figure 8F:
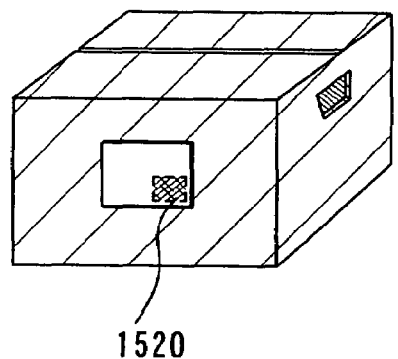

By the present invention, a semiconductor device that functions as a wireless chip can be formed. Applications for the wireless chip cover a broad range; for example, the wireless chip can be provided and used in articles such as paper currency, coins, securities, bearer bonds, certificates (driver's licenses, resident's cards, and the like; refer to FIG. 8A), packaging and containers (wrapping paper, bottles, and the like; refer to FIG. 8C), recording media (DVD software, video tapes, and the like; refer to FIG. 8B), vehicles (bicycles and the like; refer to FIG. 8D), personal belongings (bags, glasses, and the like), food products, plants, animals, clothing, articles for daily living, electronic devices, and the like, as well as for luggage tags (refer to FIGS. 8E and 8F). Electronic devices refer to liquid crystal display devices, EL display devices, television devices (also called simply television, TV set, and television set), cellular phones, and the like.

The semiconductor device 1520 of the present invention can be fixed to an article by being mounted on a printed circuit board, affixed to a surface of the printed circuit board, or embedded into the printed circuit board. For example, for a book, the semiconductor device 1520 is embedded into the paper; for a package made of an organic resin, the semiconductor device 1520 is embedded into the organic resin and affixed to each article. The semiconductor device 1520 of the present invention is a small, thin, and light-weight device, and so, even after the semiconductor device is fixed to an article, design characteristics of that article are not damaged. In addition, by provision of the semiconductor device 1520 in paper currency, coins, securities, bearer bonds, certificates, and the like, an authentication function can be provided, and if this authentication function is utilized, forgery can be prevented. Furthermore, by provision of the semiconductor device 1520 in packaging and containers, recording media, personal belongings, food products, clothing, articles for daily living, electronic devices, and the like, an improvement in system efficiency of an inspection system or the like can be realized.

Figure 9:
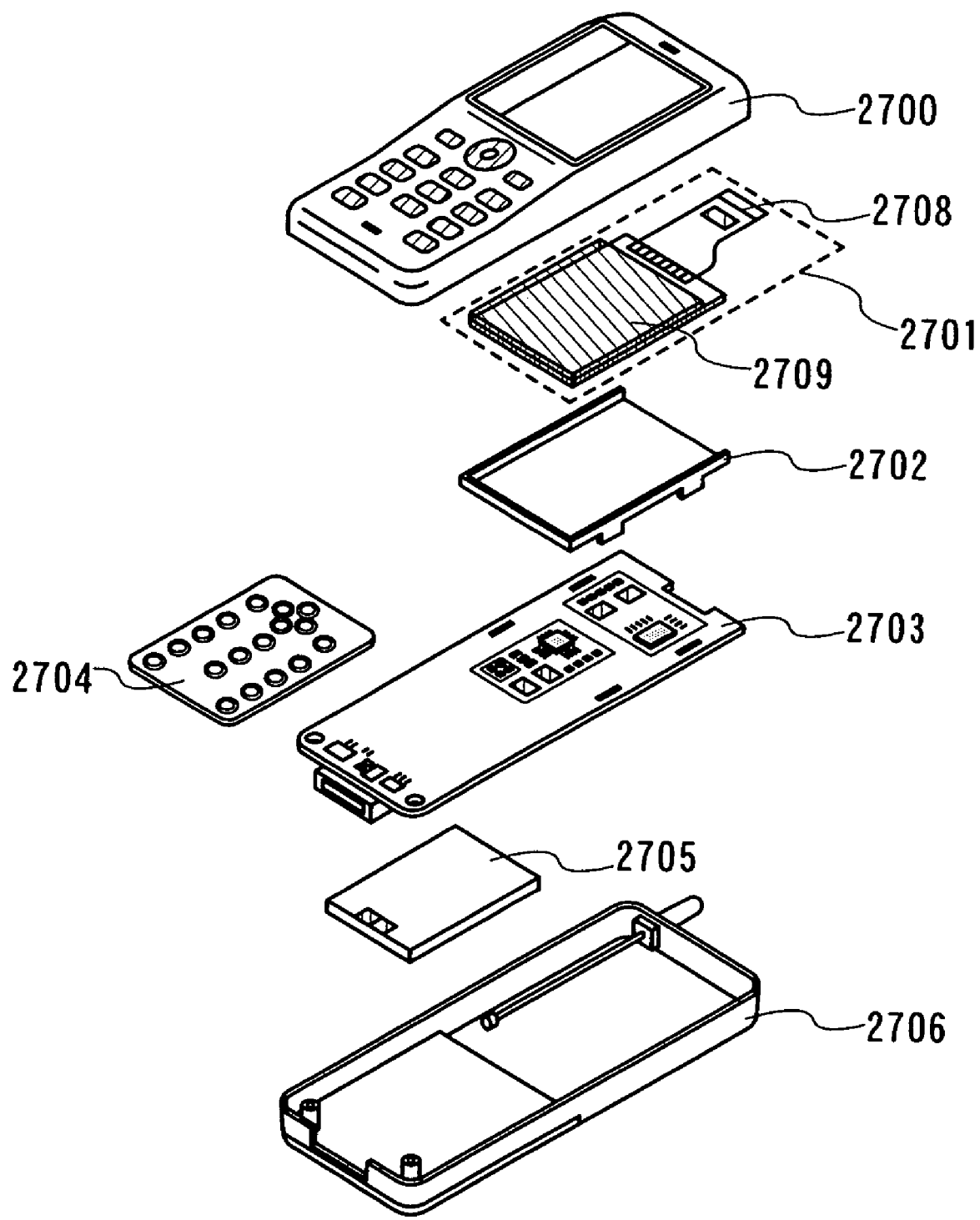
FIG. 9 is a diagram of an electronic device that includes a semiconductor device of the present invention. (Embodiment 4)
Figure 10:
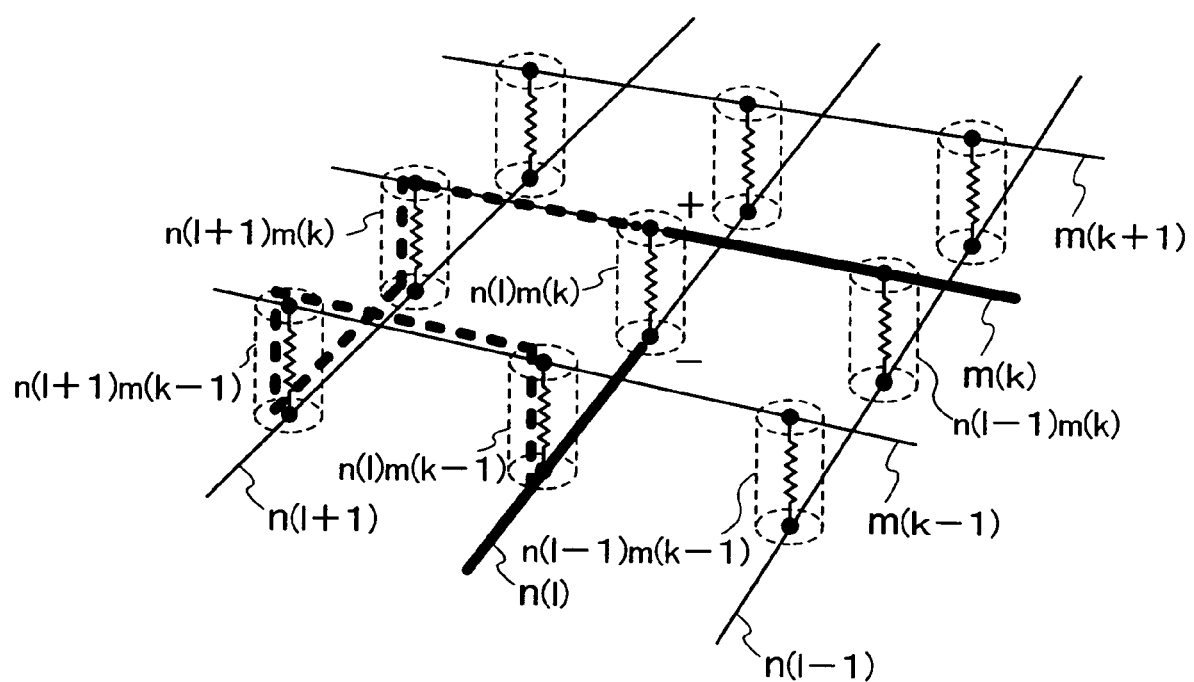
FIG. 10 is a diagram used for explaining the mechanism of crosstalk.

Next, one aspect of an electronic device in which the semiconductor device of the present invention is mounted will be described with reference to drawings. The example given here of the electronic device is a cellular phone device that includes cases 2700 and 2706, a panel 2701, a housing 2702, a printed wiring board 2703, operation buttons 2704, and a battery 2705 (refer to FIG. 9). The panel 2701 is incorporated into the housing 2702 detachably, and the housing 2702 is fitted to the printed wiring board 2703. The housing 2702 is matched to the panel 2701 incorporated into the electronic device, and the shape and size of the housing 2702 may be changed appropriately. A plurality of packaged semiconductor devices are mounted on the printed wiring board 2703, and the semiconductor device of the present invention can be used for one of these semiconductor devices. Each of the plurality of semiconductor devices mounted on the printed wiring board 2703 functions as any of the following: a controller, a central processing unit (CPU), a memory, a power supply circuit, a speech processing circuit, a transmitting and receiving circuit, or the like.

The panel 2701 is bonded to the printed wiring board 2703 with a bonding film 2708. The above panel 2701, housing 2702, and printed wiring board 2703, as well as the operation buttons 2704 and the battery 2705, are placed inside the cases 2700 and 2706. A pixel region 2709 included in the panel 2701 is arranged so as to be visible through an aperture window provided in the case 2700.

As stated above, the semiconductor device of the present invention is small, thin, and light-weight; therefore, the limited amount of space inside the cases 2700 and 2706 of the electronic device can be used effectively.

In addition, because the semiconductor device of the present invention includes a memory element with a simple structure in which an organic layer is interposed between a pair of conductive layers, an electronic device using a low-cost semiconductor device can be provided. Furthermore, because the semiconductor device of the present invention is one in which a high level of density is easily achieved, an electronic device using a semiconductor device that includes a memory circuit with a large storage capacity can be provided.

Moreover, a memory device included in the semiconductor device of the present invention is nonvolatile, and writing of data is performed by electrical operations from an external source. Because of this, data can be written to a memory cell to which no data has been written when desired. Due to the above characteristics, forgery by rewriting of data can be prevented, but new data can also be written to the memory device. Consequently, an electronic device that uses the semiconductor device that is highly functional and has a high added value can be provided.

It is to be noted that the cases 2700 and 2706 show one example of the shape and outward appearance of a cellular phone, but the electronic device of the present invention can be configured in a variety of modes according to the functions and applications of the electronic device.

The present embodiment can be freely combined with Embodiment Mode 1, Embodiment Mode 2, Embodiment Mode 3, Embodiment 1, Embodiment 2, and Embodiment 3.

Through use of the configuration of the present invention, the problem originating from crosstalk can be solved, and a passive matrix memory device can be provided. As a result, a memory device with a high level of integration can be provided. Compared to an active matrix element, there is a fewer number of manufacturing steps for a passive matrix element, manufacturing costs can be greatly reduced, and industrial applicability of the present invention is great. This application is based on Japanese Patent Application serial No. 2006-177737 filed with the Japan Patent Office on Jun. 28, 2006, the entire contents of which are hereby incorporated by reference.

What is claimed is:

1. A semiconductor device comprising:
   a first electrode;
   a first layer containing a first metal oxide formed over and being in direct contact with the first electrode;
   a second layer containing a second metal oxide formed over and being in direct contact with the first layer containing the first metal oxide;
   a layer containing an organic compound formed over and being in direct contact with the second layer containing the second metal oxide; and
   a second electrode formed over and being in contact with the layer containing an organic compound,
   wherein the first layer containing the first metal oxide and the second layer containing the second metal oxide form a p-n junction.

2. The semiconductor device according to claim 1,
   wherein the first metal oxide is selected from nickel oxide, cobalt oxide, iron oxide, manganese oxide, bismuth oxide, chromium oxide, lanthanum chromite, and lanthanum manganite.

3. The semiconductor device according to claim 1,
   wherein the second metal oxide is selected from zinc oxide, titanium oxide, iron oxide, barium titanate, tin oxide, and potassium oxide.

4. The semiconductor device according to claim 1, wherein the first electrode is provided over a flexible substrate.

5. The semiconductor device according to claim 1, further comprising an antenna and a driving circuit to drive the semiconductor device,
   wherein the driving circuit is electrically connected to the antenna.

6. The semiconductor device according to claim 1,
   wherein the semiconductor device is arranged to change a thickness of the layer containing the organic compound when data is written to the semiconductor device by applying a voltage between the first and second electrodes.

* * * * *